(12) United States Patent
Wyatt

(10) Patent No.: US 7,598,773 B2
(45) Date of Patent: Oct. 6, 2009

(54) RADIATION HARDENED LOGIC CIRCUITS

(75) Inventor: Michael A. Wyatt, Clearwater, FL (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 11/926,622

(22) Filed: Oct. 29, 2007

(65) Prior Publication Data

US 2009/0108866 A1  Apr. 30, 2009

(51) Int. Cl.
*H03K 19/007* (2006.01)
*H03K 19/00* (2006.01)

(52) U.S. Cl. .................... 326/109; 326/23; 326/83; 326/84

(58) Field of Classification Search ............... 326/109, 326/23, 26, 27, 84, 83, 22, 110
See application file for complete search history.

(56) References Cited

U.S. PATENT DOCUMENTS

| | | | | |
|---|---|---|---|---|
| 4,069,494 | A | * | 1/1978 | Grundy ................. 326/109 |
| 5,132,569 | A | * | 7/1992 | Matsuda ................. 326/65 |
| 7,193,451 | B2 | | 3/2007 | Hendrickson |
| 2005/0156620 | A1 | | 7/2005 | Carlson |

OTHER PUBLICATIONS

Mark N. Horenstein, "Microelectronic Circuits & Devices", 1990 by Prentice-Hall, Inc. pp. 753-755.*
Radiation Hardening, Wikipedia Foundation, Inc., Aug. 8, 2007, pp. 1-6.
Q. Zhou et al., "Cost-Effective Radiation Hardening Technique for Combinational Logic", IEEE, 2004, pp. 100-106.
D. C. Mayer et al., "Designing Integrated Circuits to Withstand Space Radiation", Crosslink, 2003.

* cited by examiner

*Primary Examiner*—Daniel D Chang
(74) *Attorney, Agent, or Firm*—RatnerPrestia

(57) ABSTRACT

A radiation hardened inverter includes first and second electrical paths between an input terminal and an output terminal. A first PFET is disposed in the first electrical path, and a bipolar junction transistor (BJT) is disposed in the second electrical path. The first PFET is configured to convert a low level signal at the input terminal to a high level signal at the output terminal, and the BJT is configured to convert a high level signal at the input terminal to a low level signal at the output terminal. The radiation hardened inverter includes a second PFET disposed in the second electrical path. The second PFET is configured to provide a path for bleeding excess current away from the BJT. The radiation hardened inverter also includes a current limiting PFET disposed in the second electrical path. The current limiting PFET is configured to limit current flowing into a base of the BJT. The radiation hardened inverter is free-of any NFETs.

19 Claims, 4 Drawing Sheets

RADIATION HARDENED LOGIC CIRCUITS

FIELD OF THE INVENTION

This invention relates, generally, to radiation hardened logic circuits. More particularly, this invention relates to radiation hardened logic circuits that are resistant to damage caused by charges developed in the circuit after long exposure to ionizing radiation.

BACKGROUND OF THE INVENTION

Environments with high levels of ionizing radiation create special design challenges. A single charged particle may knock thousands of electrons loose, causing electronic noise and signal spikes. In the case of digital circuits, this may cause results which are inaccurate or unintelligible. This is a particularly serious problem in the design of artificial satellites, spacecraft, military aircraft, nuclear power stations, and nuclear weapons. In order to ensure the proper operation of such systems, manufacturers of integrated circuits and sensors intended for the aerospace markets employ various methods of radiation hardening. The resulting systems are said to be radiation-hardened.

Typical sources of exposure of electronics to ionizing radiation are solar wind and the Van Allen radiation belts for satellites, nuclear reactors in power plants for sensors and control circuits, residual radiation from isotopes in chip packaging materials, cosmic radiation for both high-altitude airplanes and satellites, and nuclear explosions for potentially all military and civilian electronics.

Two types of space radiation are of particular concern for spacecraft electronics designers. The first, known as the total ionizing dose, represents the cumulative effect of many particles hitting a device throughout the course of its mission life, slowly degrading the device until it ultimately fails. The second involves high-energy particles that penetrate deep into materials and components, leaving a temporary trail of free charge carriers in their wake. If these particles hit vulnerable spots in the circuit, they may produce adverse effects, described generally as single-event effects.

One type of electronic component often found aboard a satellite is the complementary metal-oxide semiconductor (CMOS) integrated circuit. As commercial CMOS processes have advanced, the inherent radiation resistance of these devices has improved. For example, the current that flows through CMOS transistors is governed by a low-voltage gate over each device, isolated by a layer of oxide. These insulating layers may develop a charge after long exposure to ionizing radiation, and this charge may affect the flow of current through the device. As circuits have shrunk, however, the thicknesses of these insulating layers have decreased, presenting less opportunity for charge buildup.

More problematic are the radiation-induced increases in leakage current. Leakage also increases the amount of current flowing in the circuit, when the device is in a quiescent state. Such an increase, multiplied by the tens of millions of switches in each circuit, may drive up power consumption. In an extreme case, the isolation between discrete components may also be lost, rendering the circuit useless.

SUMMARY OF THE INVENTION

To meet this and other needs, and in view of its purposes, the present invention provides a radiation hardened inverter including first and second electrical paths between an input terminal and an output terminal. A first PFET is disposed in the first electrical path, and a bipolar junction transistor (BJT) is disposed in the second electrical path. The first PFET is configured to convert a low level signal at the input terminal to a high level signal at the output terminal, and the BJT is configured to convert a high level signal at the input terminal to a low level signal at the output terminal. The radiation hardened inverter includes a second PFET disposed in the second electrical path. The second PFET is configured to provide a path for bleeding excess current away from the BJT. The radiation hardened inverter also includes a current limiting PFET disposed in the second electrical path. The current limiting PFET is configured to limit current flowing into a base of the BJT. The radiation hardened inverter is free-of any NFETs.

The first PFET includes a gate connected to the input terminal, a source connected to a voltage reference, and a drain connected to the output terminal. The second PFET includes a gate connected to a ground reference, a source connected to a base of the BJT, and a drain connected to the ground reference. The BJT includes a collector connected to the output terminal, and an emitter connected to the ground reference. A current limiting PFET is disposed in the second electrical path. The current limiting PFET includes a gate connected to the ground reference, a source connected to the input terminal, and a drain connected to the base of the BJT. A capacitor is coupled between the second PFET and the input terminal for speeding up conversion of the low level signal at the input terminal to the high level signal at the output terminal.

Another embodiment of the invention is a radiation hardened NAND gate having first and second electrical paths between a first input terminal and an output terminal. Third and fourth electrical paths are included between a second input terminal and the output terminal. The NAND gate also includes a first PFET disposed in the first electrical path, a first BJT disposed in the second electrical path, a second PFET disposed in the third electrical path, and a second BJT disposed in the fourth electrical path. The first and second PFETs convert a low level signal at the first or second input terminal to a high level signal at the output terminal. The first and second BJTs convert high level signals, respectively, at the first and second input terminals to a low level signal at the output terminal. The radiation hardened NAND gate includes a third PFET disposed in the second electrical path, and a fourth PFET disposed in the fourth electrical path. The third and fourth PFETs, respectively, bleed excess current away from the first and second BJTs. The radiation hardened NAND gate also includes first and second current limiting PFETs disposed, respectively, in the second and fourth electrical paths. The first and second current limiting PFETs are configured to limit current flowing into a respective base of the first and second BJTs. The radiation hardened NAND gate is free-of any NFETs.

The first PFET includes a gate connected to the first input terminal, a source connected to a voltage reference, and a drain connected to the output terminal. The third PFET includes a gate connected to a ground reference, a source connected to a base of the first BJT, and a drain connected to the ground reference. The first BJT includes a collector connected to the output terminal, and an emitter connected to a collector of the second BJT. The second PFET includes a gate connected to the second input terminal, a source connected to the voltage reference, and a drain connected to the output terminal. The fourth PFET includes a gate connected to the ground reference, a source connected to a base of the second BJT, and a drain connected to the ground reference. The second BJT includes an emitter connected to the ground reference. A first current limiting PFET is disposed in the second electrical path. The first current limiting PFET includes a gate connected to the ground reference, a source connected to the first input terminal, and a drain connected to the base of the first BJT. A second current limiting PFET is disposed in the fourth electrical path. The second current limiting PFET includes a gate connected to the ground reference, a source connected to the second input terminal, and a drain connected to the base of the second BJT. A first capacitor is coupled between the third PFET and the first input terminal for speeding up conversion of the low level signal at the first input terminal to the high level signal at the output terminal. A second capacitor is coupled between the fourth PFET and the second input terminal for speeding up conversion of the low level signal at the second input terminal to the high level signal at the output terminal.

It is understood that the foregoing general description and the following detailed description are exemplary, but are not restrictive, of the invention.

BRIEF DESCRIPTION OF THE FIGURES

The invention is best understood from the following detailed description when read in connection with the accompanying drawing. Included in the drawing are the following figures.

DETAILED DESCRIPTION OF THE INVENTION

Figure 1:
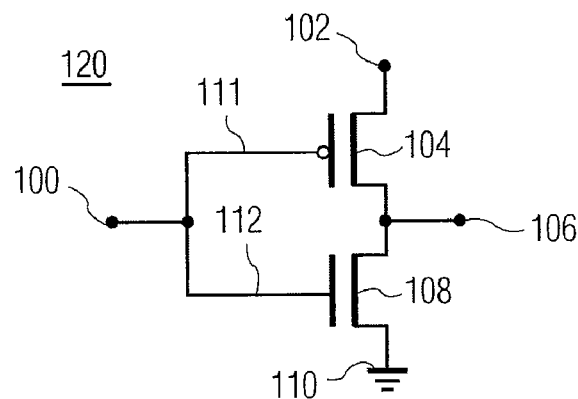
FIG. 1 is a conventional inverter circuit.

FIG. 1 shows a conventional CMOS inverter circuit including PFET 104, NFET 108, input terminal 100, output terminal 106, voltage reference 102 and ground reference 110. Input terminal 100 is connected to the gate of PFET 104 by way of first electrical path 111. Input terminal 100 is also connected to the gate of NFET 108 by way of second electrical path 112. The drain of PFET 104 and the source of NFET 108 are connected to output terminal 106. Furthermore, the source of PFET 104 is connected to voltage reference 102 and, in addition, the drain of NFET 108 is connected to ground reference 110.

Operation of CMOS inverter circuit 120 will now be described. In general, an inverter circuit produces an output signal that is complimentary to its input signal. In operation, when a logic 1 input signal is applied to input terminal 100, PFET 104 is turned off and NFET 108 is turned on. Because PFET 104 is turned off, voltage reference 102 is not applied to output terminal 106. Because NFET 108 is turned on, ground reference 110 is applied to output terminal 106, thereby providing a logic 0 output signal. When a logic 0 input signal is applied to input terminal 100, PFET 104 is turned on and NFET 108 is turned off. Because NFET 108 is turned off, ground reference 110 is not applied to output terminal 106. Because PFET 104 is turned on, voltage reference 102 is applied to output terminal 106, thereby providing a logic 1 output signal.

Figure 2:
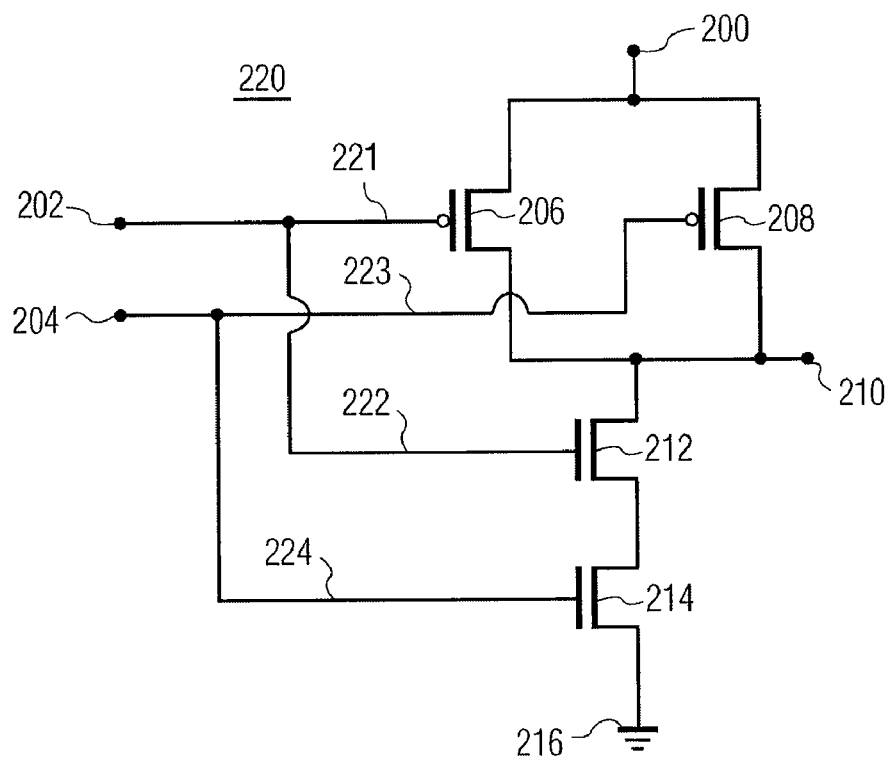
FIG. 2 is a conventional NAND gate circuit.

FIG. 2 shows a conventional CMOS NAND circuit 220 including PFET 206, PFET 208, NFET 212, NFET 214, input terminal 202, input terminal 204, output terminal 210, voltage reference 200, and ground reference 216. Input terminal 202 is connected to the gate of PFET 206 by way of first electrical path 221. Input terminal 202 is also connected to the gate of NFET 212 by way of second electrical path 222. Input terminal 204 is connected to the gate of PFET 208 by way of third electrical path 223. Input terminal 204 is also connected to the gate of NFET 214 by way of fourth electrical path 224. Voltage reference 200 is connected to the sources of PFET 206 and PFET 208. Output terminal 210 is connected to the drains of PFET 206 and PFET 208 and the source of NFET 212. The drain of NFET 212 is connected to the source of NFET 214. Furthermore, the drain of NFET 214 is connected to ground reference 216.

Operation of the standard CMOS NAND circuit 220 will now be described. In general, a NAND circuit produces a logic 0 output signal, when both input signals are a logic 1. Any other possible input signal levels produce a logic 1 output signal. More, specifically, when a logic 0 input signal is applied to input terminals 202 and 204, both PFET 206 and PFET 208 are turned on and both NFET 212 and NFET 214 are turned off. With both PFET 206 and PFET 208 turned on, voltage reference 200 is applied to output terminal 210, thereby providing a logic 1 output signal. On the other hand, when a logic 0 input signal is applied to input terminal 202 and a logic 1 input signal is applied to input terminal 204, both PFET 206 and NFET 214 are turned on, and both PFET 208 and NFET 212 are turned off. With PFET 206 turned on, voltage reference 200 is applied to output terminal 210, thereby providing a logic 1 output signal.

Similarly, when a logic 1 input signal is applied to input terminal 202 and a logic 0 input signal is applied to input terminal 204, both PFET 206 and NFET 214 are turned off, and both PFET 208 and NFET 212 are turned on. With PFET 208 turned on, voltage reference 200 is applied to output terminal 210, thereby providing a logic 1 output signal. On the other hand, when a logic 1 input signal is applied to both input terminal 202 and input terminal 204, both PFET 206 and PFET 208 are turned off and both NFET 212 and NFET 214 are turned on. With both NFET 206 and NFET 208 turned on, ground reference 216 is applied to output terminal 210, thereby providing a logic 0 output signal.

Because CMOS inverter circuit 120 and CMOS NAND circuit 220 include NFET components, they are susceptible to failure from long term radiation. The inventor has discovered that by replacing all NFET components with bipolar junction transistor (BJT) components, a logic circuit becomes more radiation hardened. Since a logic circuit includes combinations of one or more inverter circuits and/or one or more NAND circuits, any logic circuit may be formed to provide a desired logical function. More importantly, any logic circuit may be radiation hardened using embodiments of the invention described below.

The following provides a description of the building blocks of a logic circuit, namely an inverter circuit and a NAND circuit, which are radiation hardened, in accordance with the present invention. The description refers to FIGS. 3 and 5, which depict basic inverter and NAND circuits, respectively, that are radiation hardened, because all NFET components in the CMOS circuits have been eliminated. Furthermore, the description refers to FIGS. 4 and 6, which show components added to the basic inverter and NAND circuits, respectively. As will be explained, these additional components provide operational improvements to the basic logic circuits depicted in FIGS. 3 and 5.

Figure 3:
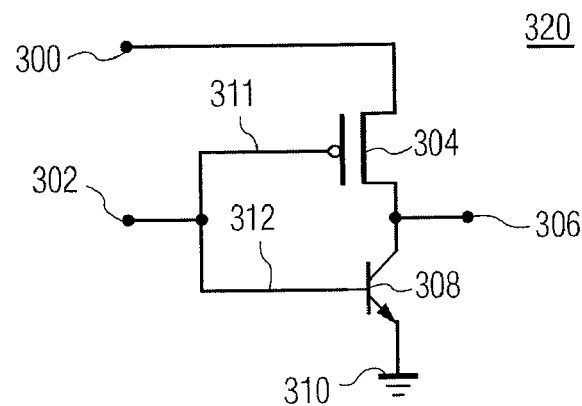
FIG. 3 is a radiation hardened inverter circuit, in accordance with an embodiment of the present invention.

Referring first to FIG. 3, there is shown a hybrid inverter circuit, generally designated as 320, where NFET 108 of FIG.

1 has been replaced with BJT 308. Hybrid inverter circuit 320 includes PFET 304, BJT 308, input terminal 302, output terminal 306, voltage reference 300 and ground reference 310. Voltage reference 300 is connected to the source of PFET 304. Input terminal 302 is connected to the gate of PFET 304 by way of first electrical path 311, and connected to the base of BJT 308 by way of second electrical path 312. Output terminal 306 is connected to the drain of PFET 304 and the collector of BJT 308. Furthermore, the emitter of BJT 308 is connected to ground reference 310.

Operation of hybrid inverter circuit 320 will now be described. Hybrid inverter circuit 320 produces an output signal that is complimentary to its input signal. In operation, when a logic 1 input signal is applied to input terminal 302, PFET 304 is turned off and BJT 308 is turned on. Because PFET 304 is turned off, voltage reference 300 is not applied to output terminal 306. Because BJT 308 is turned on, ground reference 310 is applied to output terminal 306, thereby providing a logic 0 output signal. On the other hand, when a logic 0 input signal is applied to input terminal 302, PFET 304 is turned on and BJT 308 is turned off. Because BJT 308 is turned off, ground reference 310 is not applied to output terminal 306. Because PFET 304 is turned on, voltage reference 300 is applied to output terminal 306, thereby providing a logic 1 output signal.

Figure 4:
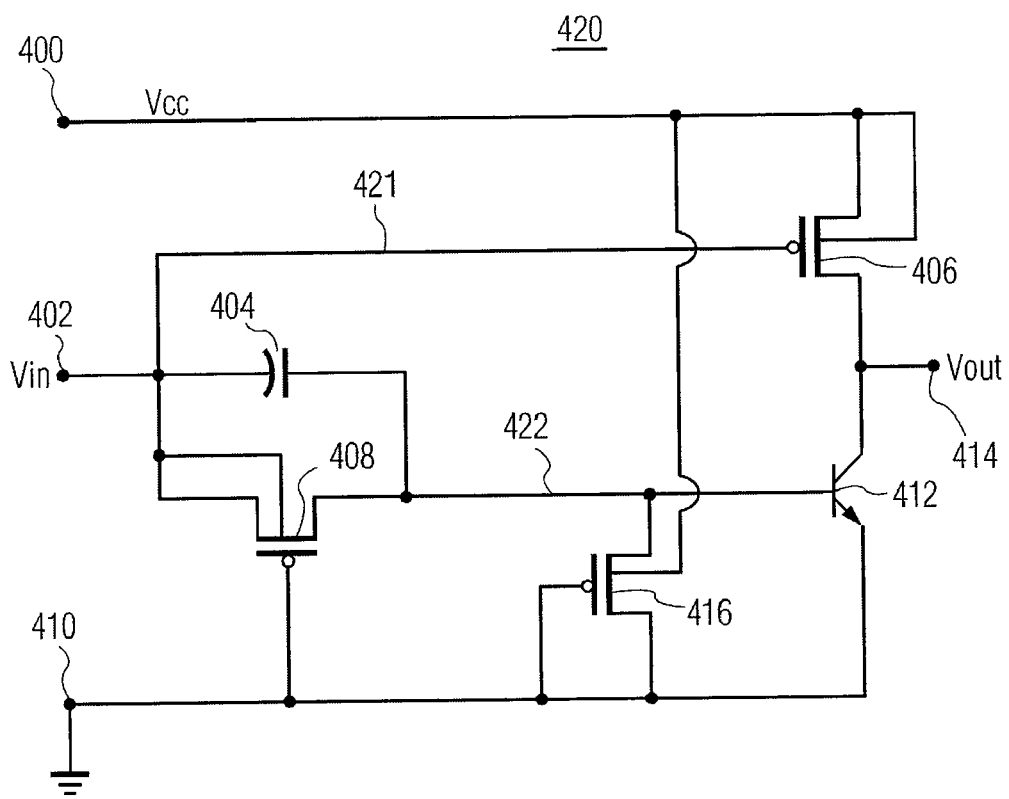
FIG. 4 is another radiation hardened inverter circuit, in accordance with an embodiment of the present invention.

Referring next to FIG. 4, there is shown another hybrid inverter circuit, generally designated as 420. Hybrid inverter circuit 420 includes components that are identical to the inverter circuit shown in FIG. 3 and additional components which improve the circuit operation. As shown, hybrid inverter circuit 420 includes first PFET 406, second PFET 416, current limiting PFET 408, BJT 412, input terminal 402, output terminal 414, capacitor 404, voltage reference 400 and ground reference 410.

Voltage reference 400 is connected to the source and substrate of first PFET 406 and the substrate of second PFET 416. Input terminal 402 is connected to the gate of first PFET 406 by way of first electrical path 421. Input terminal 402 is also coupled to the base of BJT 412 by way of second electrical path 422. Moreover, input terminal 402 is connected to the source and substrate of current limiting PFET 408 and the negative terminal of capacitor 404. The base of BJT 412 is connected to the positive terminal of capacitor 404, the drain of current limiting PFET 408, and the source of second PFET 416. The gate of current limiting PFET 408, the gate and drain of second PFET 416 and the emitter of BJT 412 are connected to ground reference 410. Output terminal 414 is connected to the drain of first PFET 406 and the collector of BJT 412.

Except for the additional components, namely capacitor 404 and PFETs 408 and 416, hybrid inverter circuit 420 of FIG. 4 operates similarly to hybrid inverter circuit 320 of FIG. 3. In operation, when a logic 1 input signal is applied to input terminal 402, first PFET 406 is turned off, by way of first electrical path 421; and PFET 408 and BJT 412 are turned on. Because first PFET 406 is turned off, voltage reference 400 is not applied to output terminal 414. Because BJT 412 is turned on, ground reference 410 is applied to output terminal 414, thereby providing a logic 0 output signal. On the other hand, when a logic 0 input signal is applied to input terminal 402, first PFET 406 is turned on, by way of first electrical path 421; and current limiting PFET 408 and BJT 412 are turned off. Because BJT 412 is turned off, ground reference 410 is not applied to output terminal 414. Because first PFET 406 is turned on, voltage reference 400 is applied to output terminal 414, thereby providing a logic 1 output signal.

BJT 412 is an NPN transistor having a semiconductor channel, which is turned on and off, in response to current flowing through its base-emitter junction. In the embodiment of FIG. 4, current limiting PFET 408 is included in hybrid inverter circuit 420 to limit the current flowing into the base of BJT 412. This prevents the base current flowing into BJT 412 from exceeding a level which may damage BJT 412.

In addition, an excessive electric charge may accumulate at the base of BJT 412. In order to bleed away any excessive electric charge from the base of BJT 412, bleeder PFET 416 is connected to the base of BJT 412. In this manner, any accumulating electric charge flows away from the base of BJT 412, through PFET 416, toward ground reference 410. Since the gate of PFET 416 is connected to the ground reference, PFET 416 is on and is able to conduct any current from its source to its drain.

As also shown in FIG. 4, speed up capacitor 404 is included between input terminal 402 and the base of BJT 412. During a logic state change at input terminal 402, speed up capacitor 404 provides a current spike to the base of BJT 412, thereby decreasing the interval between a logic transition time at the input terminal and the BJT turn on/off time.

Figure 5:
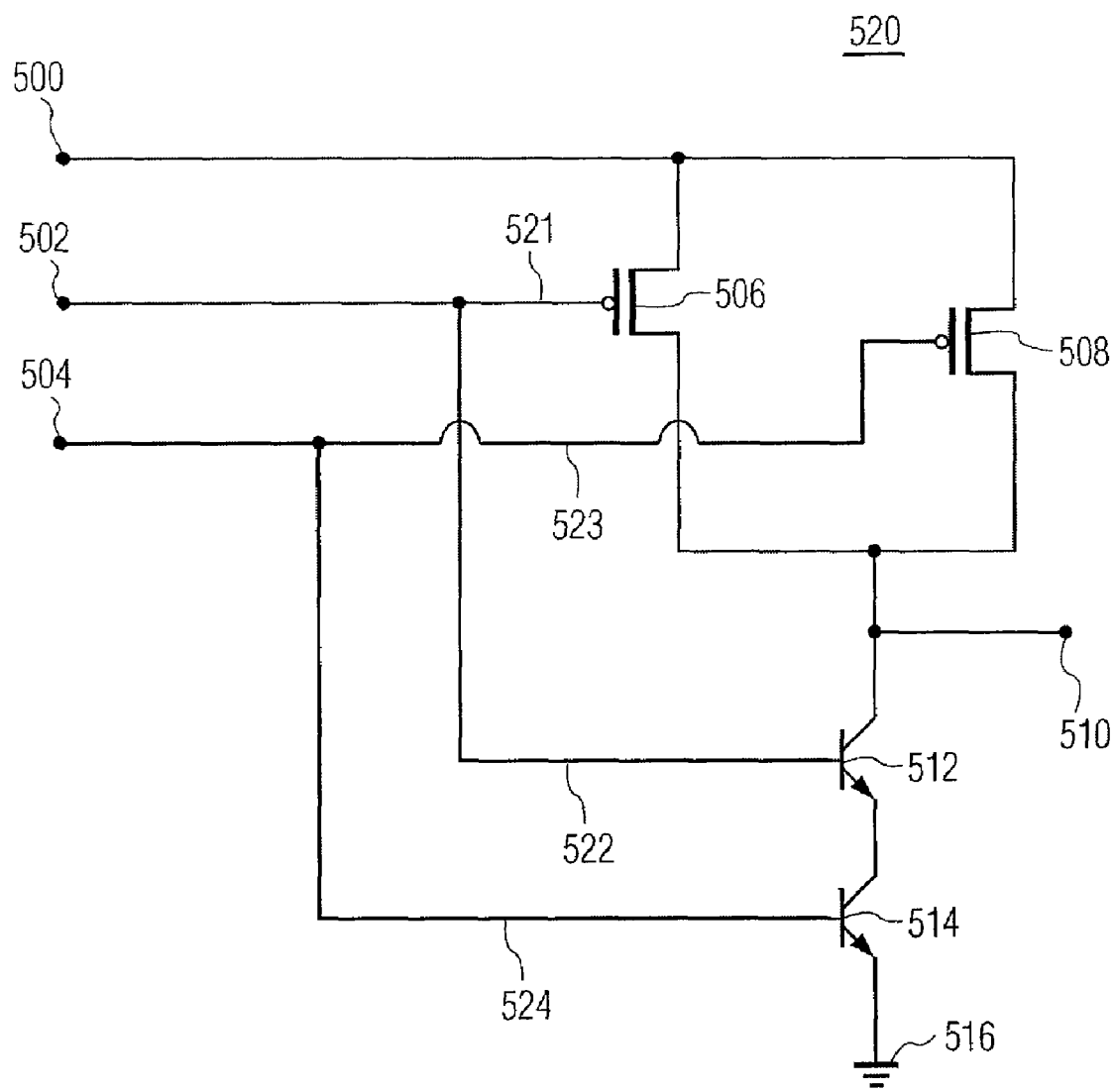
FIG. 5 is a radiation hardened NAND gate circuit, in accordance with an embodiment of the present invention.

Referring next to FIG. 5, there is shown a hybrid NAND circuit, generally designated as 520, where both NFETs of FIG. 2 have been replaced with two BJTs. As shown, hybrid NAND circuit 520 includes PFET 506, PFET 508, BJT 512, BJT 514, input terminal 502, input terminal 504, output terminal 510, voltage reference 500, and ground reference 516. Input terminal 502 is connected to the gate of PFET 506 by way of first electrical path 521. Input terminal 502 is also connected to the base of BJT 512 by way of second electrical path 522. Input terminal 504 is connected to the gate of PFET 508 by way of third electrical path 523. Input terminal 504 is also connected to the base of BJT 514 by way of fourth electrical path 524. Voltage reference 500 is applied to the sources of both PFET 506 and PFET 508. Output terminal 510 is connected to the drain of PFET 506, the drain of PFET 508 and the collector of BJT 512. The emitter of BJT 512 is connected to the collector of BJT 514. Furthermore, the emitter of BJT 514 is connected to ground reference 516.

Operation of hybrid NAND circuit 520 will now be described. Hybrid NAND circuit 520 provides a logic 0 output signal when both input signals are logic 1. Any other possible input signal levels provides a logic 1 output signal. More specifically, when a logic 0 input signal is applied to both input terminals 502 and 504, both PFET 506 and PFET 508 are turned on and both BJT 512 and BJT 514 are turned off. With both PFET 506 and PFET 508 turned on, voltage reference 500 is applied to output terminal 510, thereby providing a logic 1 output signal. On the other hand, when a logic 0 input signal is applied to input terminal 502 and a logic 1 input signal is applied to input terminal 504, both PFET 506 and BJT 514 are turned on, and both PFET 508 and BJT 512 are turned off. With PFET 506 turned on, voltage reference 500 is applied to output terminal 510, thereby providing a logic 1 output signal.

Similarly, when a logic 1 input signal is applied to input terminal 502 and a logic 0 input signal is applied to input terminal 504, both PFET 506 and BJT 514 are turned off, and both PFET 508 and BJT 512 are turned on. With PFET 508 turned on, voltage reference 500 is applied to output terminal 510, thereby providing a logic 1 output signal. On the other hand, when a logic 1 input signal is applied to both input terminal 502 and input terminal 504, both PFET 506 and PFET 508 are turned off and both BJT 512 and BJT 514 are turned on. With both BJT 512 and BJT 514 turned on, ground reference 516 is applied to output terminal 510, thereby providing a logic 0 output signal.

Figure 6:
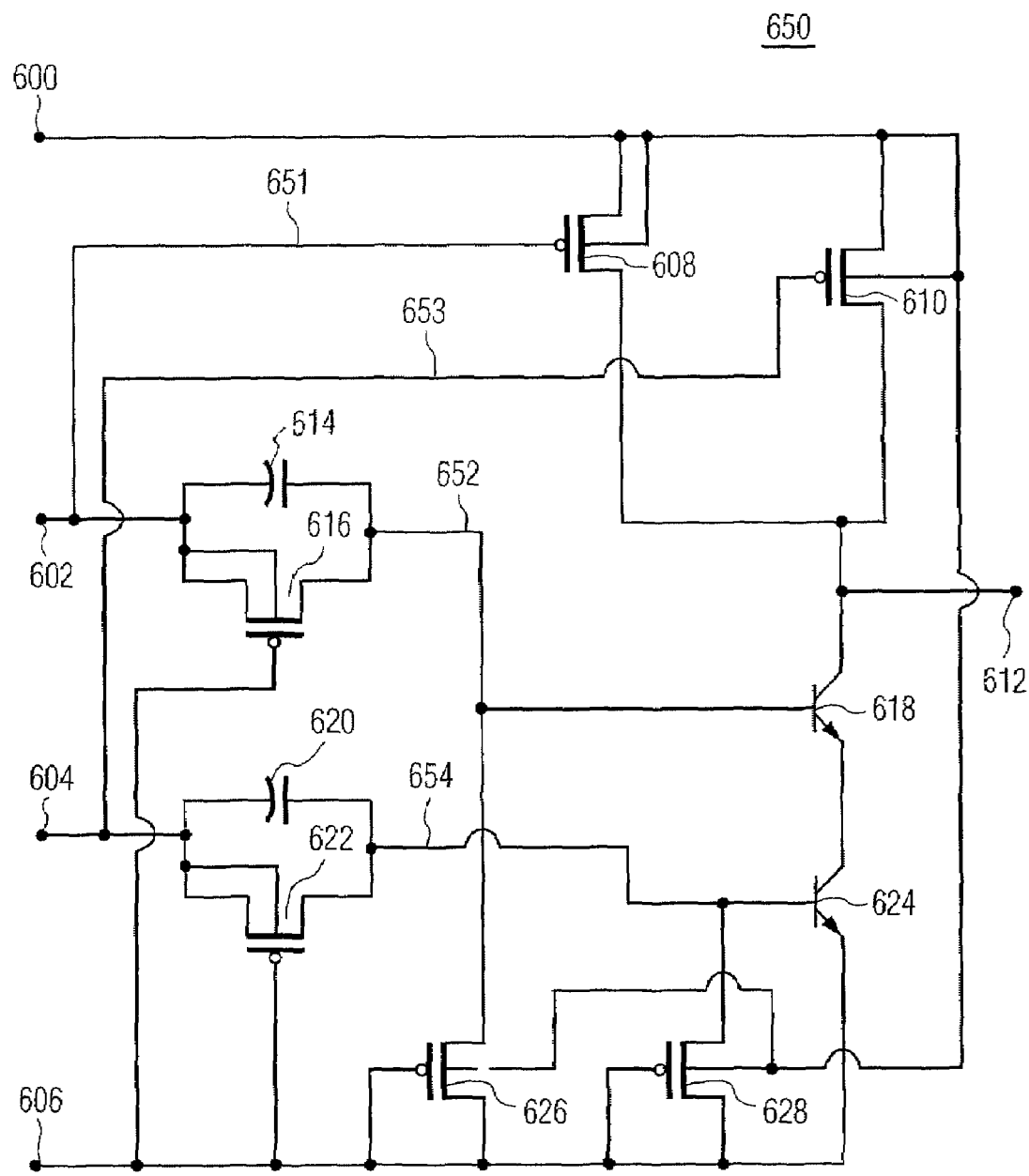
FIG. 6 is another radiation hardened NAND gate circuit, in accordance with an embodiment of the present invention.

Referring now to FIG. 6, there is shown another hybrid NAND circuit, generally designated as 650. Hybrid NAND circuit 650 includes components that are identical to NAND circuit 520 shown in FIG. 5 and additional components to improve circuit operation. As shown, hybrid NAND circuit 650 includes first PFET 608, second PFET 626, third PFET 610, fourth PFET 628, current limiting PFET 616, current limiting PFET 622, first BJT 618, second BJT 624, capacitor 614, capacitor 620, input terminal 602, input terminal 604, output terminal 612, voltage reference 600 and ground reference 606.

Input terminal 602 is connected to the gate of first PFET 608 by way of first electrical path 651, the negative terminal of capacitor 614 and the source and substrate of current limiting PFET 616. Input terminal 604 is connected to the gate of third PFET 610 by way of third electrical path 653, the negative terminal of capacitor 620 and the source and substrate of current limiting PFET 622. Voltage reference 600 is connected to the source and substrate of first PFET 608 and third PFET 610. Voltage reference 600 is also connected to the substrate of second PFET 626 and third PFET 628. Output terminal 612 is connected to the drain of first PFET 608, the drain of third PFET 610 and to the collector of first BJT 618.

The emitter of first BJT 618 is connected to the collector of second BJT 624. The base of first BJT 618 is connected to the positive terminal of capacitor 614, the drain of current limiting PFET 616 and the source of second PFET 626, by way of second electrical path 652. The base of second BJT 624 is connected to the positive terminal of capacitor 620, the drain of current limiting PFET 622 and the source of fourth PFET 628, by way of fourth electrical path 654. Ground reference 606 is connected to the emitter of second BJT 624, the gate of PFET 616, the gate of PFET 622, the gate and drain of PFET 626 and the gate and drain of PFET 628.

Operation of hybrid NAND circuit 650 will now be described. Hybrid NAND circuit 650 provides a logic 0 output signal when both inputs signals are logic 1. Any other possible input signal levels produce a logic 1. More specifically, when a logic 0 input signal is applied to both input terminal 602 and input terminal 604, both first PFET 608 and third PFET 610 are turned on. In addition, current limiting PFET 616, current limiting PFET 622, first BJT 618 and second BJT 624 are turned off. With both first PFET 608 and third PFET 610 turned on, voltage reference 600 is applied to output terminal 612, thereby providing a logic 1 output signal. On the other hand, when a logic 0 input signal is applied to input terminal 602 and a logic 1 input signal is applied to input terminal 604, first PFET 608, current limiting PFET 622 and second BJT 624 are turned on. In addition, third PFET 610, current limiting PFET 616 and first BJT 618 are turned off. With first PFET 608 turned on, voltage reference 600 is applied to output terminal 612, thereby providing a logic 1 output signal.

Similarly, when a logic 1 input signal is applied to input terminal 602 and a logic 0 input signal is applied to input terminal 604, first PFET 608, current limiting PFET 622 and second BJT 624 are turned off. In addition, third PFET 610, current limiting PFET 616 and first BJT 618 are turned on. With third PFET 610 turned on, voltage reference 600 is applied to output terminal 612, thereby providing a logic 1 output signal. On the other hand, when a logic 1 input signal is applied to both input terminal 602 and input terminal 604, both first PFET 608 and third PFET 610 are turned off. In addition, first BJT 618, second BJT 624, current limiting PFET 616 and current limiting PFET 622 are turned on. With both first BJT 618 and second BJT 624 turned on, ground reference 606 is applied to output terminal 612, thereby providing a logic 0 output signal.

Accordingly, the present invention includes embodiments of a basic inverter circuit and a basic NAND circuit which are radiation hardened. In these embodiments BJT components are provided as replacements for any NFET components currently provided in conventional logic circuits. In further embodiments, a speed up capacitor, a bleeding PFET and a current limiting PFET are connected to the base of each BJT component in order to improve circuit operation of the basic inverter circuit and the basic NAND circuit. It will now be appreciated that the embodiments of the invention may also be applied to any other logic circuit, because all logic circuits are combinations of basic inverters and NAND gates.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A radiation hardened inverter comprising
   first and second electrical paths between an input terminal and an output terminal,
   a first PFET disposed in the first electrical path, and
   a bipolar junction transistor (BJT) disposed in the second electrical path,
   wherein the first PFET is configured to convert a low level signal at the input terminal to a high level signal at the output terminal,
   the BJT is configured to convert a high level signal at the input terminal to a low level signal at the output terminal, and
   a second PFET disposed in the second electrical path,
   wherein the second PFET is configured to provide a path for bleeding excess current away from the BJT.

2. The radiation hardened inverter of claim 1 including
   a current limiting PFET disposed in the second electrical path,
   wherein the current limiting PEET is configured to limit current flowing into a base of the BJT.

3. The radiation hardened inverter of claim 2 wherein
   the current limiting PFET includes a body, and
   the body is connected to the input terminal.

4. The radiation hardened inverter of claim 1 wherein
   the first PFET includes a gate connected to the input terminal, a source connected to a voltage reference, and a drain connected to the output terminal,
   the second PFET includes a gate connected to a ground reference, a source connected to a base of the BJT, and a drain connected to the ground reference, and
   the BJT includes a collector connected to the output terminal, and an emitter connected to the ground reference.

5. The radiation hardened inverter of claim 4 including
   a current limiting PFET disposed in the second electrical path,
   wherein the current limiting PFET includes a gate connected to the ground reference, a source connected to the input terminal, and a drain connected to the base of the BJT.

6. The radiation hardened inverter of claim 1 wherein
   a capacitor is coupled between the second PFET and the input terminal for speeding up conversion of the low level signal at the input terminal to the high level signal at the output terminal.

7. The radiation hardened inverter of claim 1 wherein each of the first and second PFETs includes a body, and each body is connected to one voltage reference.

8. The radiation hardened inverter of claim 1 wherein the first and second paths are free-of an NFET.

9. The radiation hardened inverter of claim 1 wherein the BJT is configured to reduce dosing effects due to one of ionizing radiation in outer space, residual radiation from isotopes in chip packaging material, or radiation from nuclear explosion.

10. A radiation hardened NAND gate comprising
first and second electrical paths between a first input terminal and an output terminal,
third and fourth electrical paths between a second input terminal and the output terminal,
a first PFET disposed in the first electrical path,
a first BJT disposed in the second electrical path,
a second PFET disposed in the third electrical path, and
a second BJT disposed in the fourth electrical path,
wherein the first and second PFETs convert a low level signal at the first or second input terminal to a high level signal at the output terminal,
the first and second BJTs convert high level signals, respectively, at the first and second input terminals to a low level signal at the output terminal
a third PFET disposed in the second electrical path, and
a fourth PFET disposed in the fourth electrical path,
wherein the third and fourth PFETs, respectively, bleed excess current away from the first and second BJTs.

11. The radiation hardened NAND gate of claim 10 including
first and second current limiting PFETs disposed, respectively, in the second and fourth electrical paths,
wherein the first and second current limiting PFETs are configured to limit current flowing into a respective base of the first and second BJTs.

12. The radiation hardened NAND gate of claim 11 wherein
the first and second current limiting PFETs include first and second bodies, and
the first body is connected to the first input terminal, and
the second body is connected to the second input terminal.

13. The radiation hardened NAND gate of claim 10 wherein
the first PFET includes a gate connected to the first input terminal, a source connected to a voltage reference, and a drain connected to the output terminal,
the third PFET includes a gate connected to a ground reference, a source connected to a base of the first BJT, and a drain connected to the ground reference,
the first BJT includes a collector connected to the output terminal, and an emitter connected to a collector of the second BJT,
the second PFET includes a gate connected to the second input terminal, a source connected to the voltage reference, and a drain connected to the output terminal,
the fourth PFET includes a gate connected to the ground reference, a source connected to a base of the second BJT, and a drain connected to the ground reference, and
the second BJT includes an emitter connected to the ground reference.

14. The radiation hardened NAND gate of claim 13 including
a first current limiting PFET disposed in the second electrical path,
wherein the first current limiting PEET includes a gate connected to the ground reference, a source connected to the first input terminal, and a drain connected to the base of the first BJT, and
a second current limiting PFET disposed in the fourth electrical path,
wherein the second current limiting PFET includes a gate connected to the ground reference, a source connected to the second input terminal, and a drain connected to the base of the second BJT.

15. The radiation hardened NAND gate of claim 10 wherein
a first capacitor is coupled between the third PFET and the first input terminal for speeding up conversion of the low level signal at the first input terminal to the high level signal at the output terminal, and
a second capacitor is coupled between the fourth PEET and the second input terminal for speeding up conversion of the low level signal at the second input terminal to the high level signal at the output terminal.

16. The radiation hardened NAND gate of claim 10 wherein
each of the first, second, third and fourth PFETs includes a body, and
each body is connected to one voltage reference.

17. The radiation hardened NAND gate of claim 10 wherein
the first, second, third and fourth electrical paths are free-of an NFET.

18. The radiation hardened NAND gate of claim 10 wherein
the first and second BJTs are configured to reduce dosing effects due to one of ionizing radiation in outer space, residual radiation from isotopes in chip packaging material, radiation from nuclear explosion.

19. The radiation hardened NAND gate of claim 10 wherein
the first and second BJTs are replacements for radiation susceptible NFETs, and provide radiation hardening.

* * * * *